(12) United States Patent
Kim et al.

(10) Patent No.: US 9,508,796 B2
(45) Date of Patent: Nov. 29, 2016

(54) INTERNAL SPACERS FOR NANOWIRE TRANSISTORS AND METHOD OF FABRICATION THEREOF

(71) Applicant: INTEL CORPORATION, Santa Clara, CA (US)

(72) Inventors: Seiyon Kim, Portland, OR (US); Daniel A. Simon, Hillsboro, OR (US); Nadia M. Rahhal-Orabi, Hillsboro, OR (US); Chul-Hyun Lim, Portland, OR (US); Kelin J. Kuhn, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/916,093

(22) PCT Filed: Oct. 3, 2013

(86) PCT No.: PCT/US2013/063186
§ 371 (c)(1),
(2) Date: Mar. 2, 2016

(87) PCT Pub. No.: WO2015/050546
PCT Pub. Date: Apr. 9, 2015

(65) Prior Publication Data
US 2016/0211322 A1 Jul. 21, 2016

(51) Int. Cl.
*H01L 29/06* (2006.01)
*H01L 29/66* (2006.01)
(Continued)

(52) U.S. Cl.
CPC ....... *H01L 29/0673* (2013.01); *H01L 29/0649* (2013.01); *H01L 29/161* (2013.01);
(Continued)

(58) Field of Classification Search
CPC .......... H01L 29/7858; H01L 29/0673; H01L 29/785; H01L 29/78696; H01L 29/66439; H01L 29/42392; H01L 29/775; H01L 29/66545; H01L 29/66795; H01L 29/6653
See application file for complete search history.

(56) References Cited

U.S. PATENT DOCUMENTS

| 7,588,977 B2 * | 9/2009 | Suk ...................... H01L 29/0673 257/E29.229 |
| 7,803,675 B2 * | 9/2010 | Suk ........................ B82Y 10/00 257/287 |

(Continued)

FOREIGN PATENT DOCUMENTS

| TW | 200537687 A | 11/2005 |
| TW | 200807664 A | 2/2008 |

(Continued)

OTHER PUBLICATIONS

Office Action received for Taiwan Patent Application No. 103132993, mailed on Mar. 25, 2016, 8 pages of English Translation and 8 pages of Taiwanese Office Action.

(Continued)

*Primary Examiner* — Marvin Payen
*Assistant Examiner* — Jeremy Joy
(74) *Attorney, Agent, or Firm* — Winkle, PLLC

(57) ABSTRACT

A nanowire transistor of the present description may be produced with internal spacers formed by using sacrificial spacers during the fabrication thereof. Once the nanowire transistor is formed, the sacrificial spacers, which are position between the transistor gate and the source and drains (respectively), may be removed. The sacrificial material between channel nanowires of the nanowire transistor may then be removed and a dielectric material may be deposited to fill the spaces between the channel nanowires. The dielectric material not between the channel nanowires may be removed to form the internal spacers. External spacers, which are position between the transistor gate and the source and drains (respectively), may then be formed adjacent the internal spacers and transistor channel nanowires.

18 Claims, 19 Drawing Sheets

(51) Int. Cl.
  *H01L 29/161* (2006.01)
  *H01L 29/423* (2006.01)
  *H01L 29/786* (2006.01)
  *H01L 29/775* (2006.01)
  *H01L 29/78* (2006.01)

(52) U.S. Cl.
  CPC ..... *H01L29/42392* (2013.01); *H01L 29/6653* (2013.01); *H01L 29/6656* (2013.01); *H01L 29/66439* (2013.01); *H01L 29/66545* (2013.01); *H01L 29/66553* (2013.01); *H01L 29/66795* (2013.01); *H01L 29/775* (2013.01); *H01L 29/785* (2013.01); *H01L 29/78696* (2013.01)

(56) References Cited

U.S. PATENT DOCUMENTS

| | | | | |
|---|---|---|---|---|
| 2005/0142766 A1* | 6/2005 | Hareland | ............... | B82Y 10/00 438/268 |
| 2009/0302372 A1* | 12/2009 | Chang | ............... | H01L 29/66545 257/327 |
| 2010/0297816 A1* | 11/2010 | Bedell | ............... | B82Y 10/00 438/151 |
| 2012/0199886 A1 | 8/2012 | Horak et al. | | |
| 2012/0313170 A1* | 12/2012 | Chang | ............... | H01L 29/66545 257/347 |
| 2013/0017654 A1 | 1/2013 | Huang et al. | | |
| 2013/0153997 A1* | 6/2013 | Chang | ............... | B82Y 10/00 257/334 |
| 2013/0161756 A1* | 6/2013 | Glass | ............... | H01L 29/66545 257/369 |
| 2014/0264253 A1* | 9/2014 | Kim | ............... | H01L 29/0673 257/9 |

FOREIGN PATENT DOCUMENTS

| | | |
|---|---|---|
| WO | 2013/095652 A1 | 6/2013 |
| WO | 2015/050546 A1 | 4/2015 |

OTHER PUBLICATIONS

International Preliminary Report on Patentability and Written Opinion Received for PCT Patent Application No. PCT/US2013/063186, mailed on Apr. 14, 2016, 9 pages.

International Search Report and Written Opinion received for PCT Patent Application No. PCT/US2013/063186, mailed on Jul. 22, 2014, 12 pages.

* cited by examiner

INTERNAL SPACERS FOR NANOWIRE TRANSISTORS AND METHOD OF FABRICATION THEREOF

RELATED APPLICATION

The present application is a national stage entry of PCT Patent Application No. PCT/US2013/063186, filed on Oct. 3, 2013, entitled "INTERNAL SPACER FOR NANOWIRE TRANSISTORS AND METHOD OF FABRICATION THEREOF", which is hereby incorporated herein by reference in its entirety and for all purposes.

TECHNICAL FIELD

Embodiments of the present description generally relate to the field of nanowire microelectronic devices, and, more particularly, to nanowire transistors formed using internal spacers.

BACKGROUND

Higher performance, lower cost, increased miniaturization of integrated circuit components, and greater packaging density of integrated circuits are ongoing goals of the microelectronic industry for the fabrication of microelectronic devices. As these goals are achieved, the microelectronic devices scale down, i.e. become smaller, which increases the need for optimal performance from each integrated circuit component, including managing transistor drive currents while reducing short-channel effects, parasitic capacitance, and off-state leakage.

Non-planar transistors, such as fin and nanowire-based devices, enable improved control of short channel effects. For example in nanowire-based transistors, the gate electrode wraps around the full perimeter of the nanowire, enabling fuller depletion in the channel region, and reducing short-channel effects due to steeper sub-threshold current swing (SS) and smaller drain induced barrier lowering (DIBL). Wrap-around gate structures and source/drain contacts used in nanowire devices also enable greater management of leakage and capacitance in the active regions, even as drive currents increase, as will be understood to those skilled in the art.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
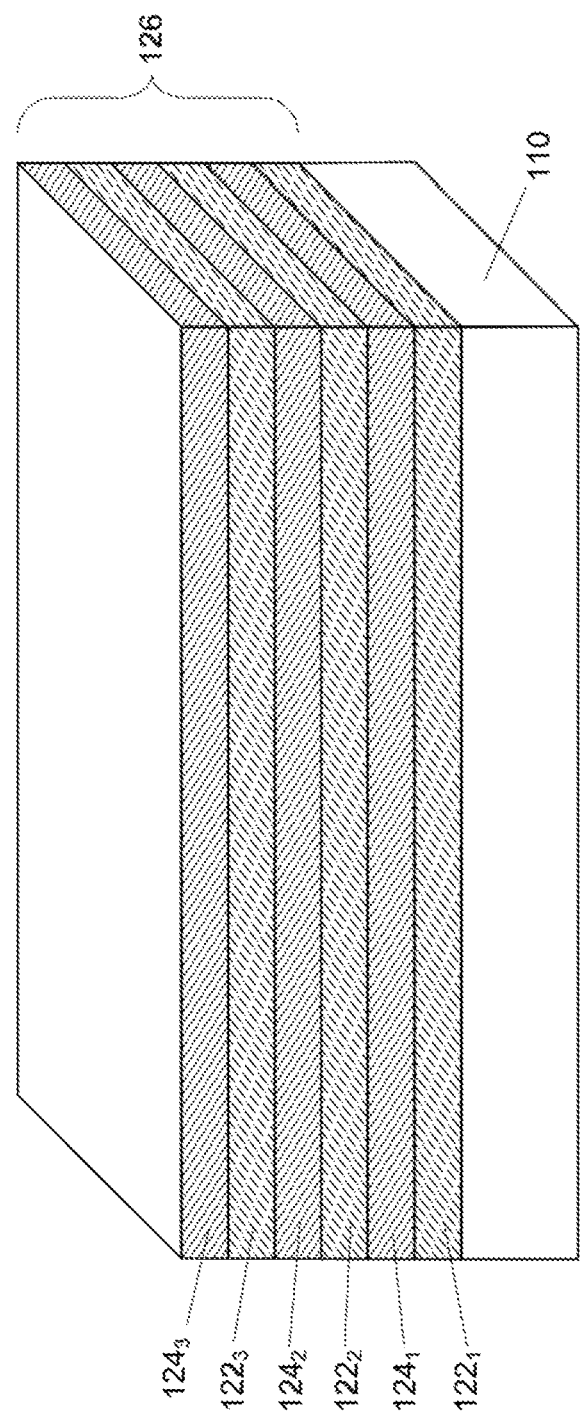
FIGS. 1-17 are oblique and side views of a process of forming a nanowire transistor, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The term "sacrificial", as used in the present description, refers a structure or material that is formed temporarily and which will be removed and replaced by another structure or material. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description include the incorporation of internal spacers in nanowire transistors. In one embodiment, the internal spacers may be formed by using sacrificial external spacers during the fabrication thereof. Once the nanowire transistor is formed, the sacrificial spacers, which are position between the gate structure (e.g. gate electrode and gate dielectric) and the source structure and drain structure (respectively), may be removed. The sacrificial material between the channel nanowires of the nanowire transistor may then be removed and a dielectric material may be deposited to fill the spaces between the channel nanowires. The dielectric material not between the channel nanowires may be removed to form the internal spacers. External spacers, which are position between the gate structure and the source structure and drain structure (respectively), may then be formed adjacent the internal spacers and transistor channel nanowires. The internal spacers may provide additional insulation between the gate structure and source/drain contacts, which reduces overlap capacitance, risk of shorting, and current leakage. The internal spacers may be formed of an insulative, low-k dielectric material. Furthermore, the internal spacers may be formed of the same or different material as the external spacers. Additionally, the internal spacers may be of the same or different thickness as the external spacers.

FIGS. 1-17 illustrate methods of forming a nanowire transistor. For the sake of conciseness and clarity, the formation of a single nanowire transistor will be illustrated. As illustrated in FIG. 1, a microelectronic substrate 110 may be provided or formed from any suitable material. In one embodiment, the microelectronic substrate 110 may be a bulk substrate composed of a single crystal of a material which may include, but is not limited to, silicon, germanium, silicon-germanium or a III-V compound semiconductor material. In other embodiments, the microelectronic substrate 110 may comprise a silicon-on-insulator substrate (SOI), wherein an upper insulator layer composed of a material which may include, but is not limited to, silicon dioxide, silicon nitride or silicon oxy-nitride, disposed on the bulk substrate. Alternatively, the microelectronic substrate 110 may be formed directly from a bulk substrate and local oxidation is used to form electrically insulative portions in place of the above described upper insulator layer.

As further shown in FIG. 1, a plurality of sacrificial material layers (illustrated as elements $122_1$, $122_2$, and $122_3$) alternating with a plurality of channel material layers (illustrated as elements $124_1$, $124_2$, and $124_3$) may be formed by any known technique, such as by epitaxial growth, on the microelectronic substrate 110 to form a layered stack 126. In one embodiment, the sacrificial material layers $122_1$, $122_2$, and $122_3$ may be silicon layers and the channel material layers $124_1$, $124_2$, and $124_3$ may be silicon germanium layers. In another embodiment, the sacrificial material layers $122_1$, $122_2$, and $122_3$ may be silicon germanium layers and the channel material layers $124_1$, $124_2$, and $124_3$ may be silicon layers. Additionally, the channel material layers $124_1$, $124_2$, and $124_3$ may also include, but not limited to, germanium, GaAs, InSb, GaP, GaSb, InAlAs, InGaAs, GaSbP, GaAsSb, and InP. Although three sacrificial material layers and three channel material layers are shown, it is understood that any appropriate number of sacrificial material layers and channel material layers may be used.

Figure 2:
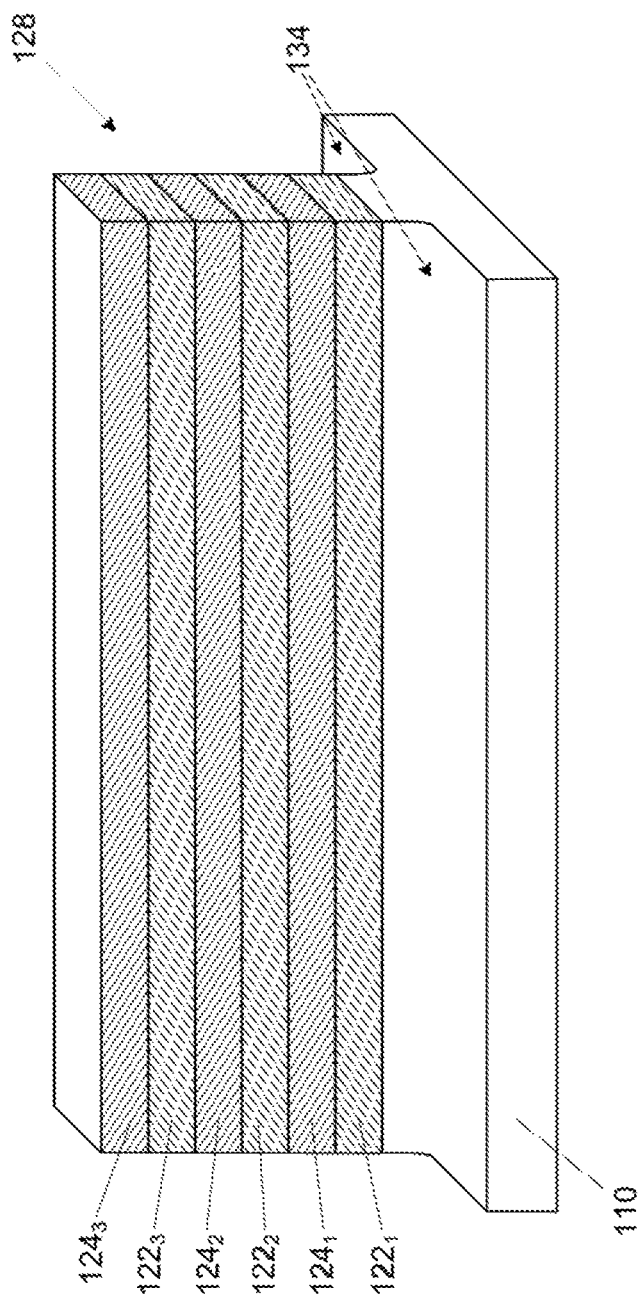

The layered stack 126 may be patterned using conventional patterning/etching techniques to form at least one fin structure 128, as shown in FIG. 2. For example, the layered stack 126 (see FIG. 1) may be etched during a trench etch process, such as during a shallow trench isolation (STI) process, wherein trenches 134 may be formed in the microelectronic substrate 110 in the formation of the fin structure 128, and wherein the trenches 134 may be formed on opposing sides of the fin structures 128. As will be understood by those skilled in the art, a plurality of substantially parallel of fin structures 128 are generally formed simultaneously.

Figure 3:
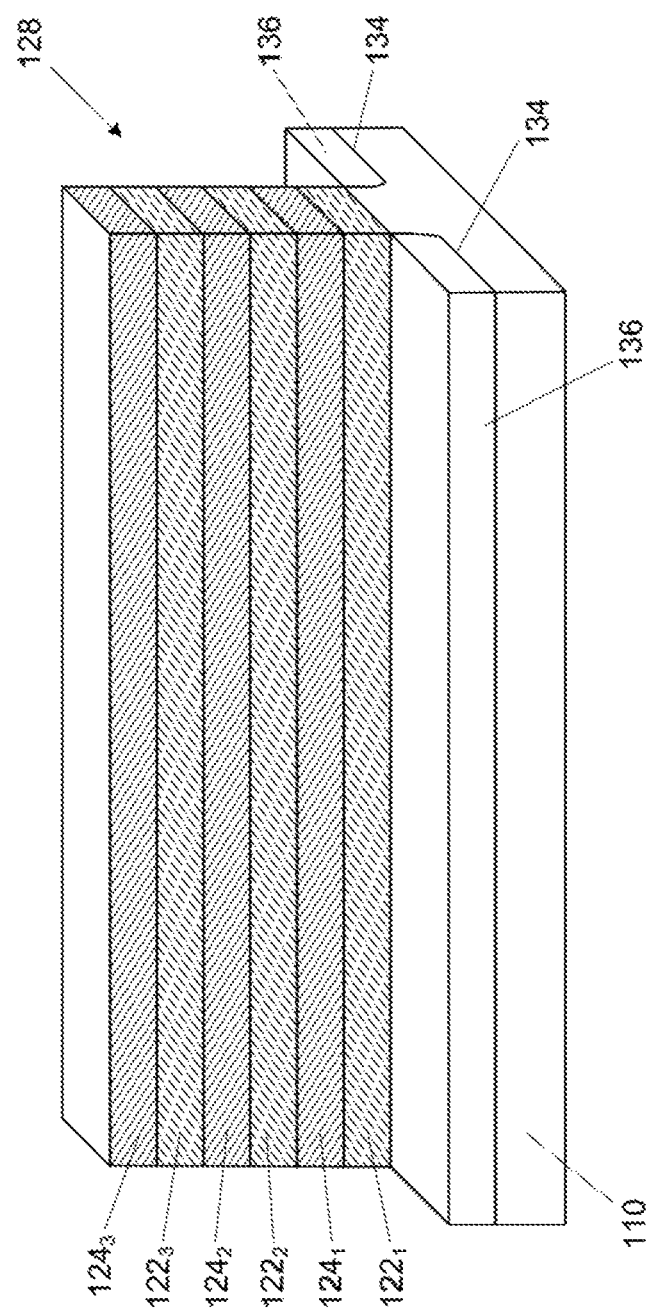

As shown in FIG. 3, dielectric material structures 136, such as silicon dioxide, may be formed or deposited within the trenches 134 proximate the microelectronic substrate 110 to electrically separate the fin structures 128. As will be understood to those skilled in the art, the process of forming the dielectric material structures 136 may involve a variety of process including, but not limited to, depositing dielectric material, polishing/planarizing the dielectric material, and etching back the dielectric material.

Figure 4:
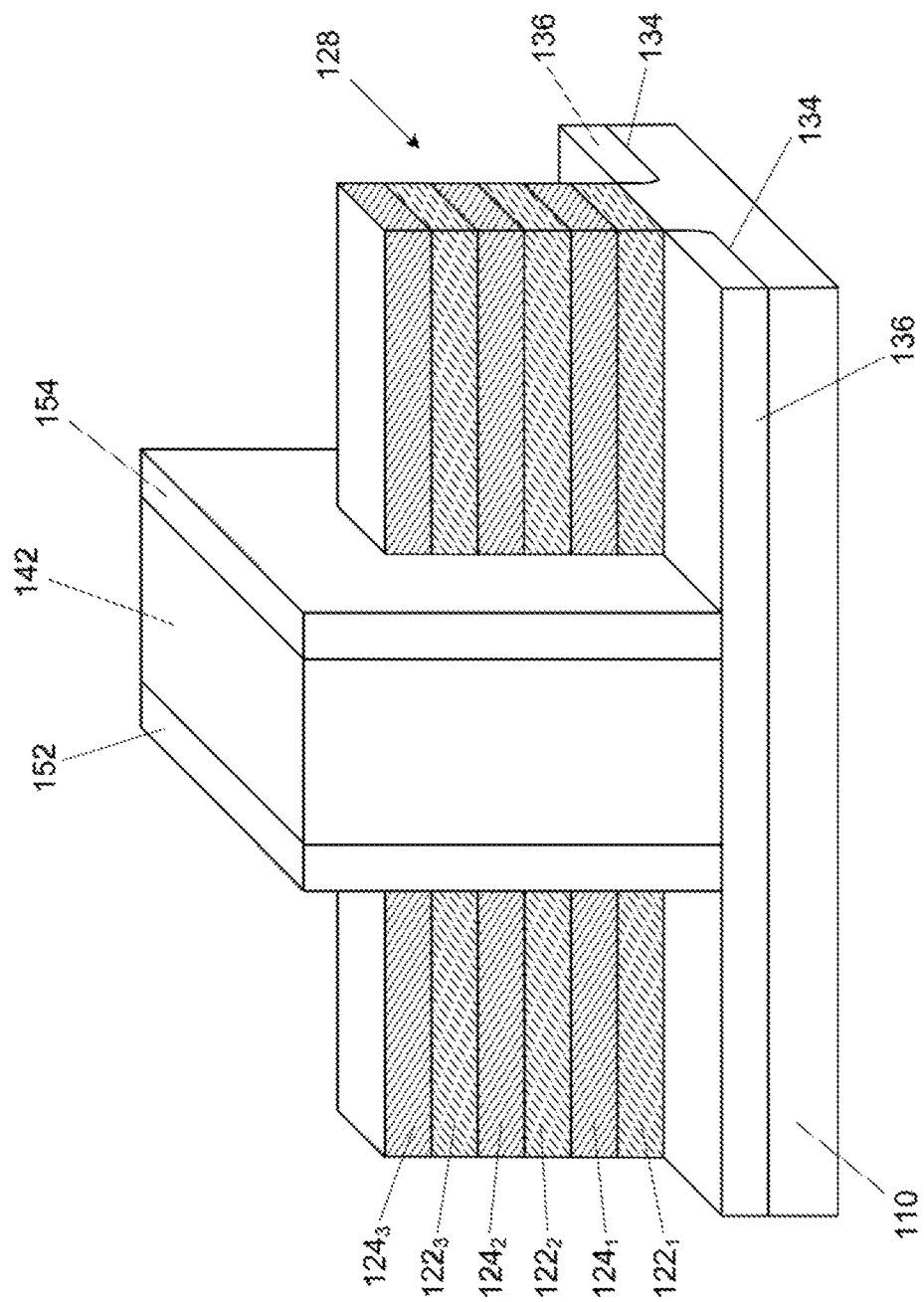

As shown in FIG. 4, a first sacrificial spacer 152 and a second sacrificial spacer 154 may be formed on and across the fin structure 128, and may be disposed substantially orthogonally with respect to the fin structure 128. In an embodiment, the first sacrificial spacer 152 and/or the second sacrificial spacer 154 may comprise any dielectric material that can be removed without impacting a sacrificial gate material, a source structure, or a drain material (each of which will be subsequently discussed), and may include, but is not limited to, silicon dioxide, silicon nitride, and silicon oxy nitride.

As further shown in FIG. 4, a sacrificial gate material 142 may be formed within/between the first sacrificial spacer 152 and the second sacrificial spacer 154, and may be formed around portions of the fin structures 128 located between the first sacrificial spacer 152 and the second sacrificial spacer 154. In an embodiment, the sacrificial gate material 142 may be formed around portions of the fin structure 128, and the first sacrificial spacer 152 and the second sacrificial spacer 154 may be on opposing sides of the sacrificial gate material 142. The sacrificial gate material 142 may comprise any appropriate sacrificial material, including, but not limited to polysilicon, silicon nitride, and silicon dioxide.

Figure 5:
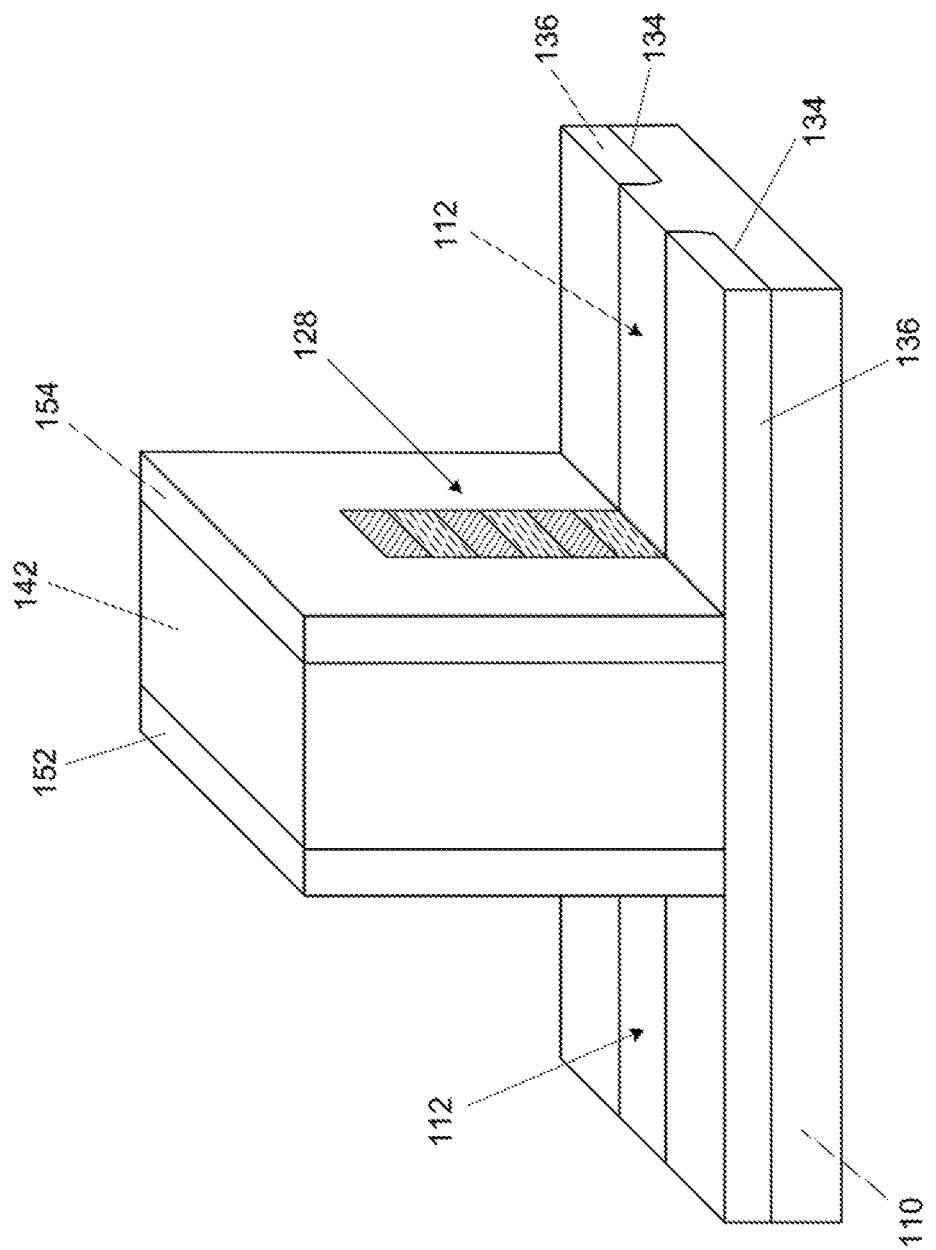

As shown in FIG. 5, a portion of each fin structure 128 external to the sacrificial gate material 142, the first sacrificial spacer 152, and the second sacrificial spacer 154 may be removed to expose portions 112 of the microelectronic substrate 110. The portions of each fin structure 128 may be removed by any process known in the art, including, but not limited to, a dry etching process.

Figure 6:
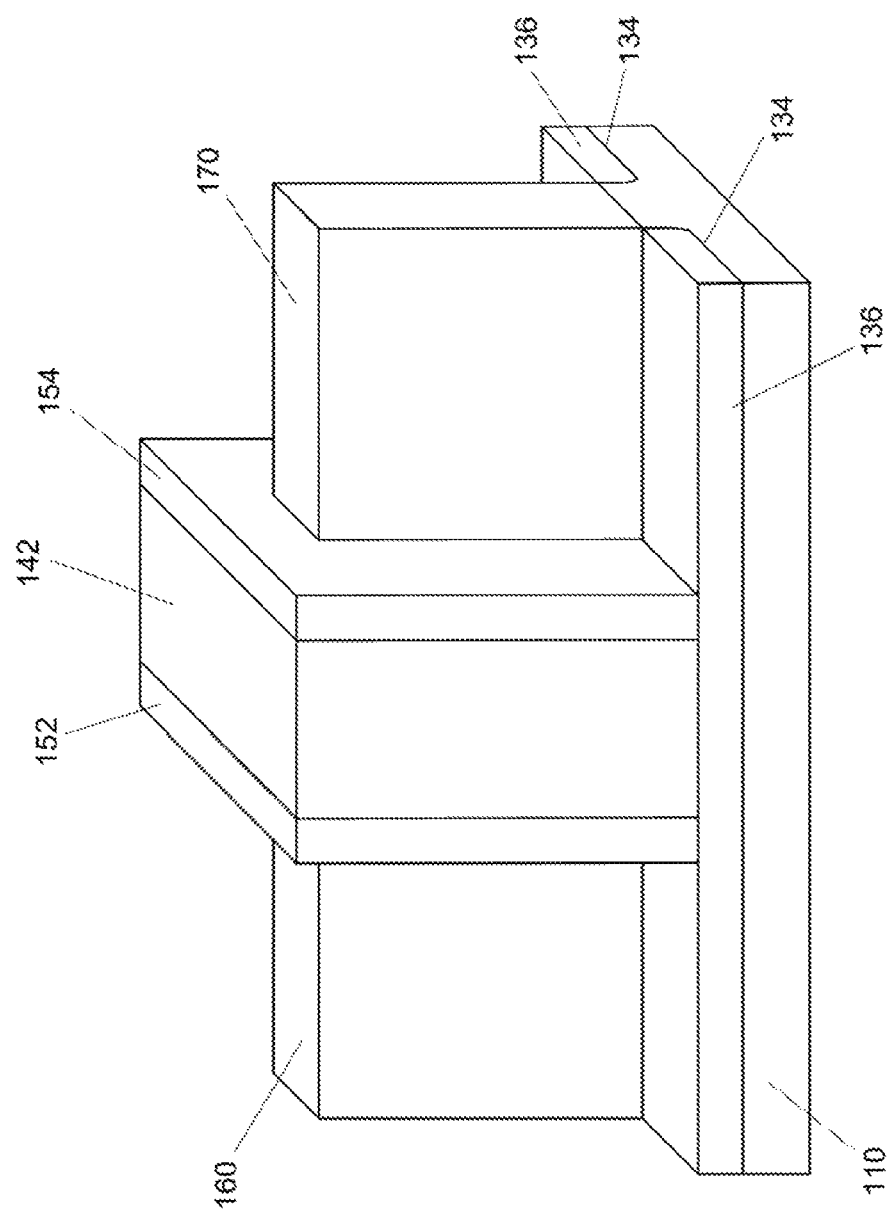

As shown in FIG. 6, a source structure 160 and a drain structure 170 may be formed on the microelectronic substrate portions 112 (see FIG. 6) on opposing ends of the fin structure 128, such as by an epitaxial growth of silicon or silicon germanium, and may be coupled to the portions of the fin structure 128 disposed between the first sacrificial spacer 152 and the second sacrificial spacer 154. In an embodiment, the source structures 160 or the drain structures 170 may be n-doped silicon for an NMOS device, or may be p-doped silicon/silicon germanium for a PMOS device, depending on the device type for the particular application. Doping may be introduced in the epitaxial process, by implant, by plasma doping, by solid source doping or by other methods as are known in the art.

Figure 7:
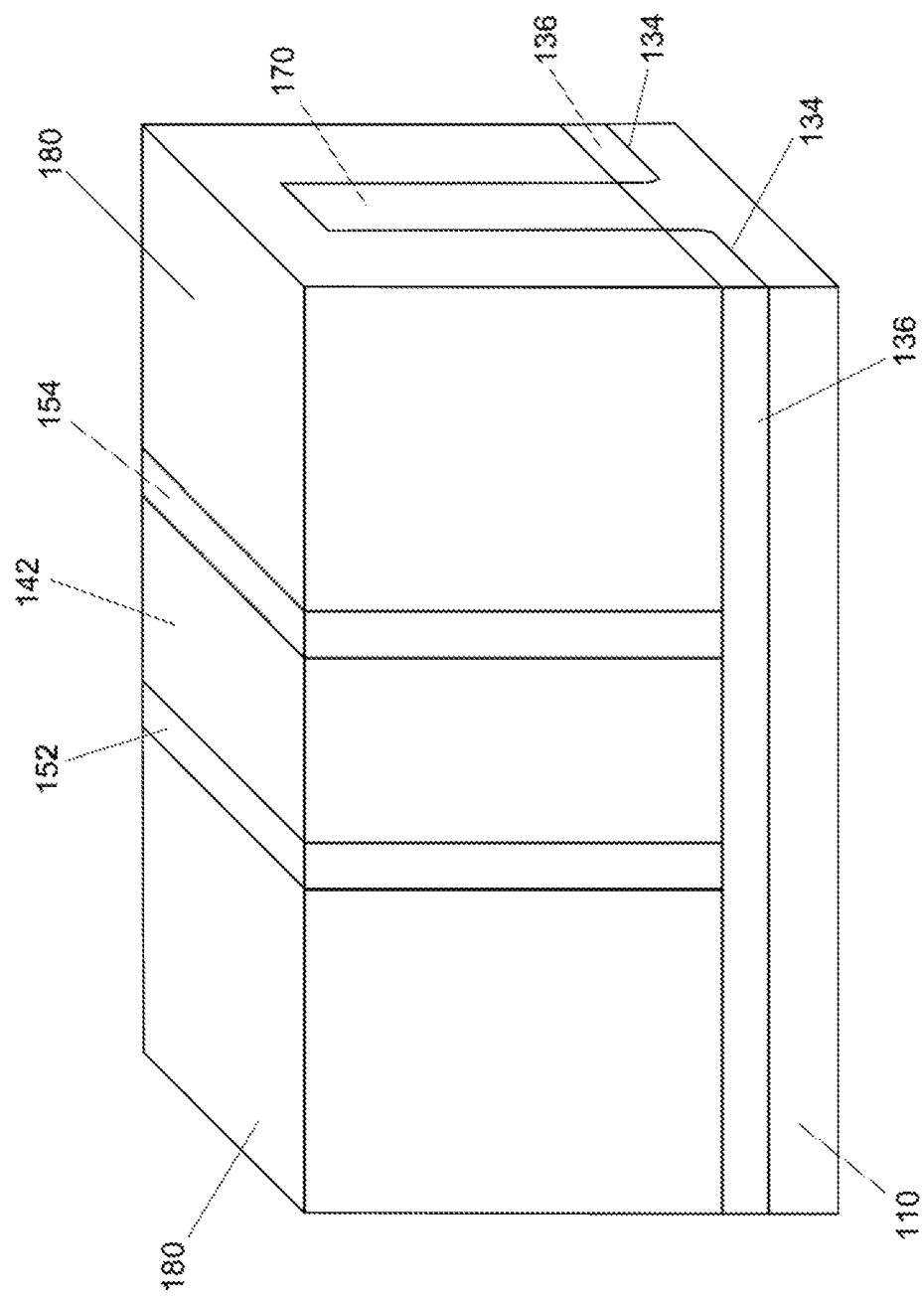

As shown in FIG. 7, an interlayer dielectric layer 180 may be formed on the microelectronic substrate 110 over the source structures 160, the drain structures 170, the sacrificial gate material 142, the first sacrificial spacer 152, and the second sacrificial spacer 154, wherein the interlayer dielectric layer 180 may be planarized, such as by chemical mechanical polishing, to expose the first sacrificial spacer 152, the second sacrificial spacer 154, and the sacrificial gate material 142.

Figure 8:
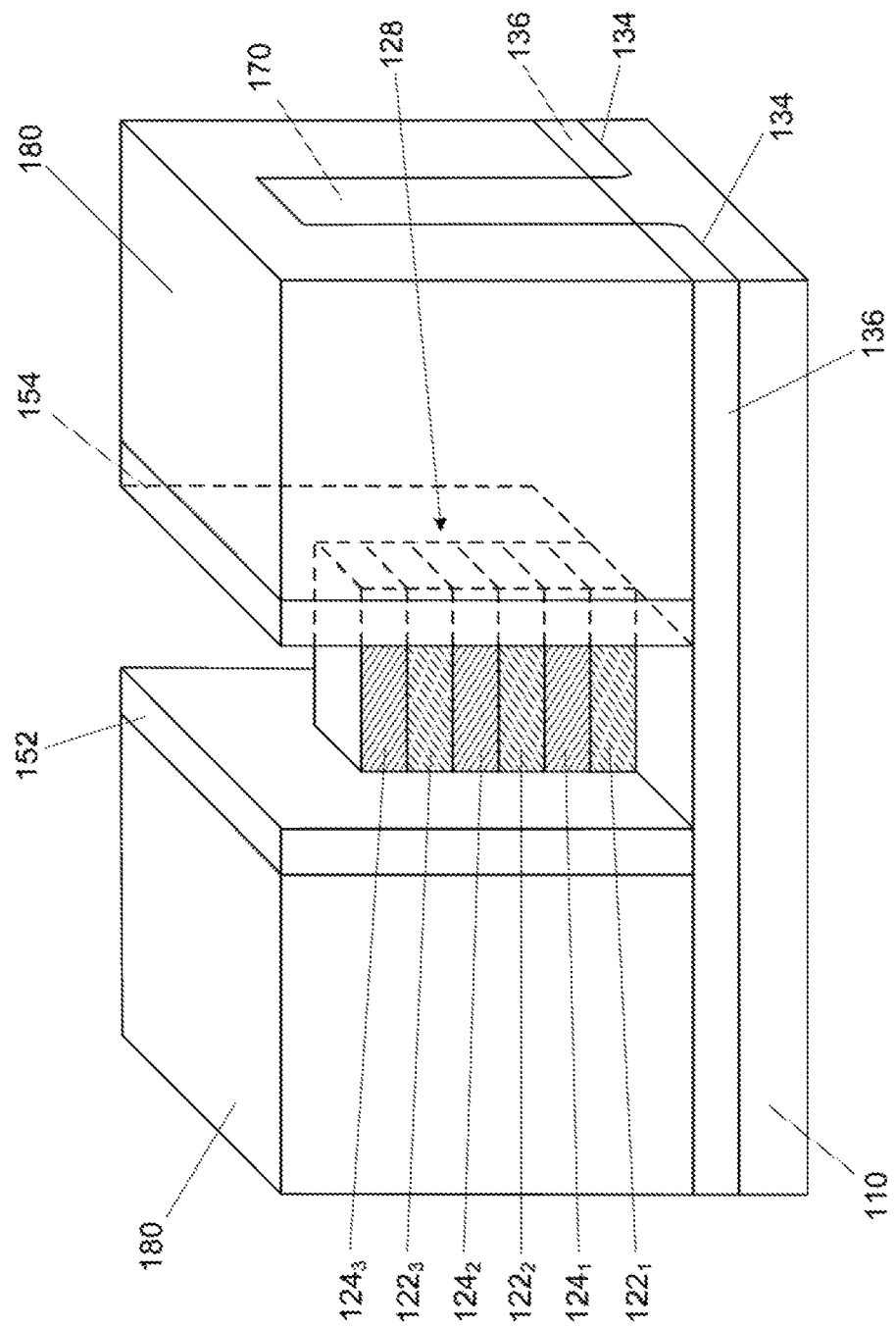

As shown in FIG. 8, the sacrificial gate material 142 may then be removed from between the first sacrificial spacer 152 and the second sacrificial spacer 154, such as by an etching process, including but not limited to a wet etch, a combination of wet etching and oxidation, or a dry etch (plasma or plasmaless etching).

Figure 9:
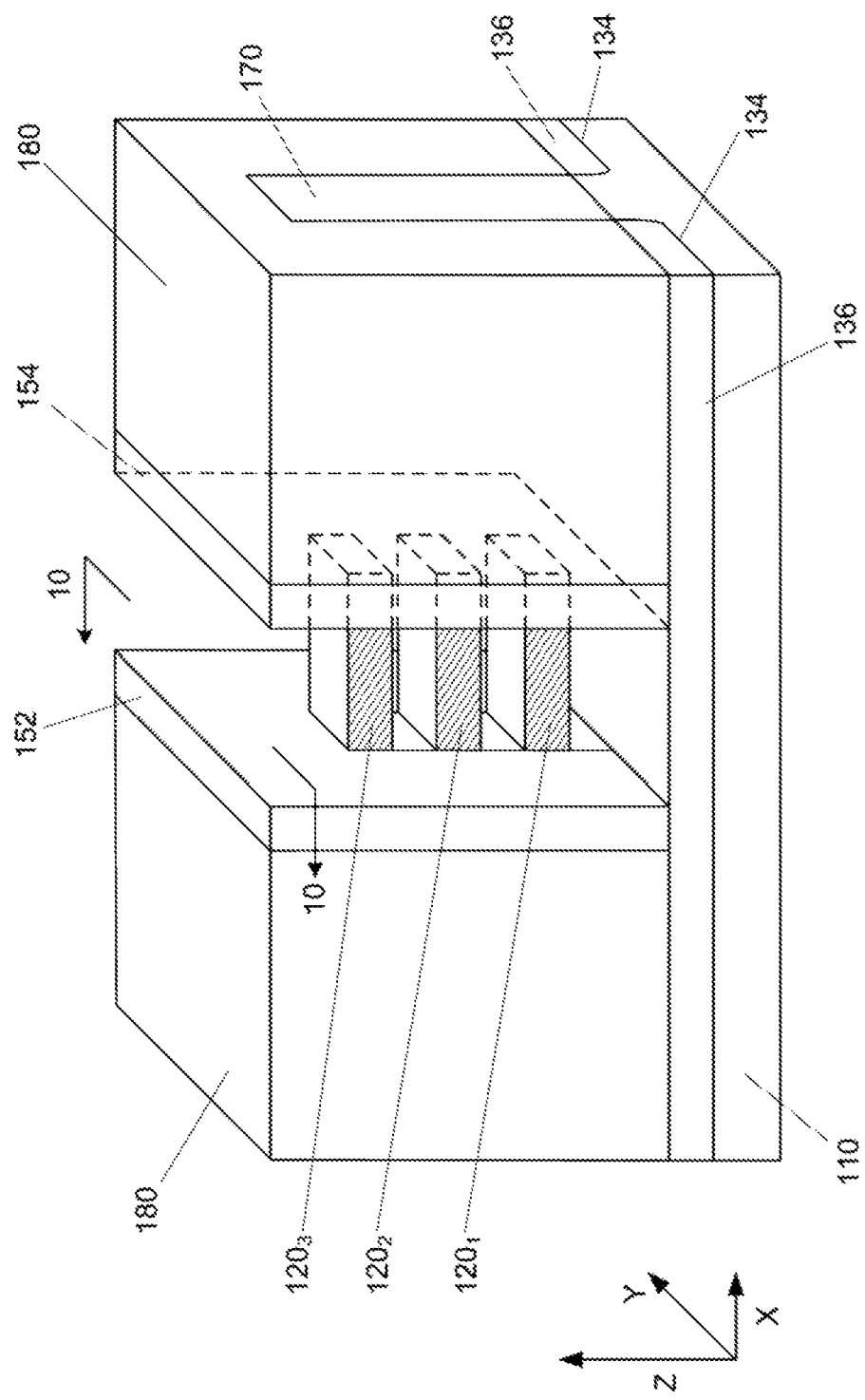

As shown in FIG. 9, the sacrificial material layers $122_1$, $122_2$, and $122_3$ (see FIG. 8) may be selectively removed from the fin structure 128 (see FIG. 8) between the channel material layers $124_1$, $124_2$, and $124_3$ (see FIG. 8) to form channel nanowires (illustrated as elements $120_1$, $120_2$, and $120_3$, and may be referred to herein collectively as "channel nanowires $120_n$") extending between the source structure 160 (see FIG. 6) and the drain structure 170, wherein the channel nanowires $120_n$ may be aligned vertically (e.g. z-direction) and spaced apart from one another. In an embodiment, the sacrificial material layers $122_1$, $122_2$, and $122_3$ may be etched with a wet etch, a combination of wet etching and oxidation, or a dry etch (plasma or plasmaless) that selectively removes the sacrificial material layers $122_1$, $122_2$, and $122_3$ while not etching the channel material layers $124_1$, $124_2$, and $124_3$. In one embodiment, wherein the sacrificial material layers $122_1$, $122_2$, and $122_3$ are silicon and the channel material layers $124_1$, $124_2$, and $124_3$ are silicon germanium, the wet etch may include, but is not limited to, aqueous hydroxide chemistries, including ammonium hydroxide and potassium hydroxide. In another embodiment, wherein the sacrificial material layers $122_1$, $122_2$, and $122_3$ are silicon germanium and the channel material layers $124_1$, $124_2$, and $124_3$ are silicon, the wet etch may include, but is not limited to solutions of carboxylic acid/nitric acid/hydrofluoric acid, and solutions of citric acid/nitric acid/hydrofluoric acid.

In an embodiment, both silicon and silicon germanium channel nanowires $120_n$ may exist on the same wafer, in the same die, or on the same circuit, for example as NMOS Si and PMOS SiGe in an inverter structure. In an embodiment with NMOS Si and PMOS SiGe in the same circuit, the Si channel thickness (SiGe interlayer) and SiGe channel thickness (Si interlayer) may be mutually chosen to enhance circuit performance and/or circuit minimum operating voltage. In an embodiment, the number of nanowires on different devices in the same circuit may be changed through an etch process to enhance circuit performance and/or circuit minimum operating voltage.

Figure 10:
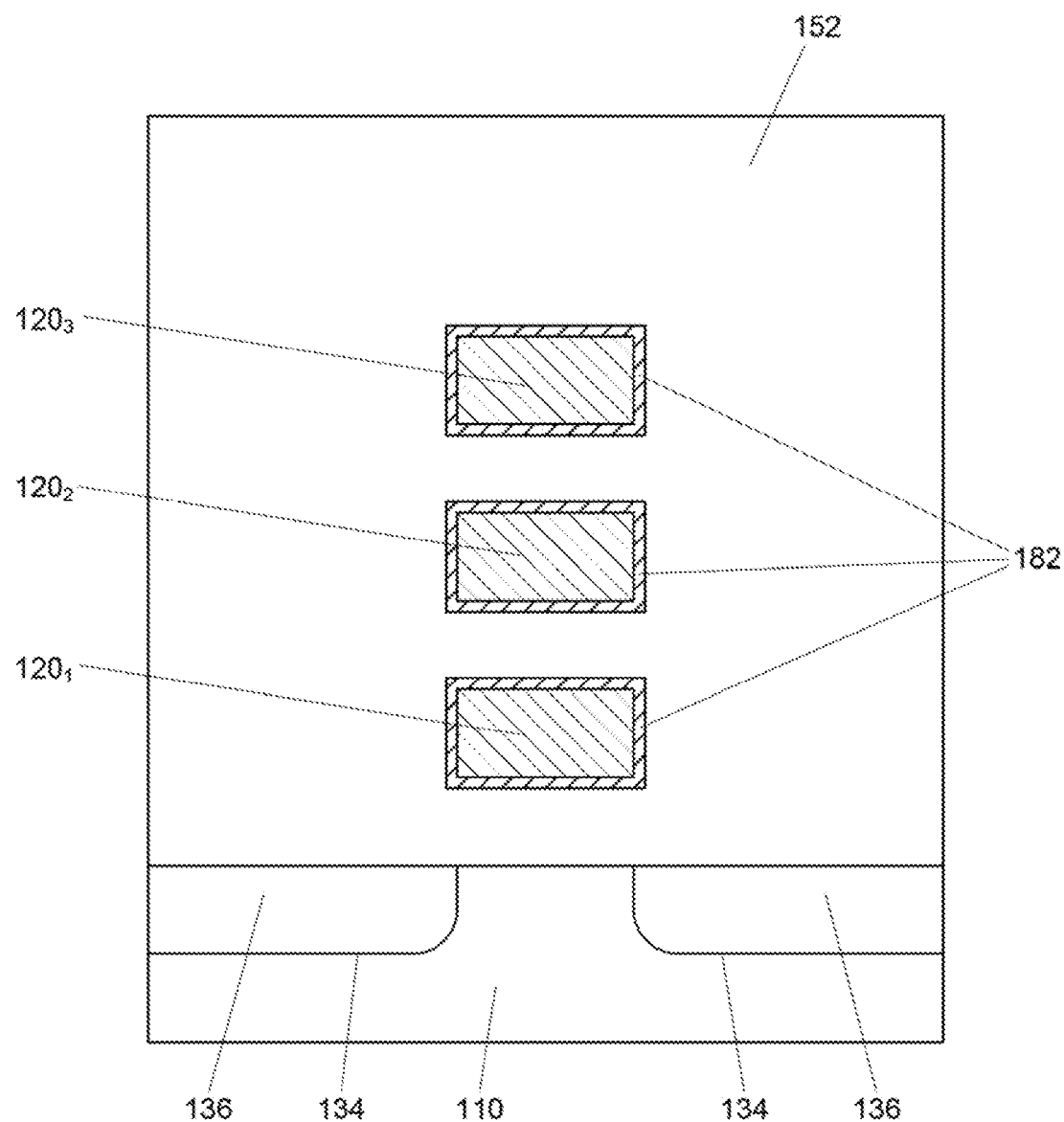

As shown in FIG. 10 (cross-section along line 10-10 of FIG. 9), a gate dielectric material 182 may be formed to surround the channel nanowires $120_1$, $120_2$, and $120_3$ between the first sacrificial spacer 152 and the second sacrificial spacer 154. In an embodiment, the gate dielectric material 182 may comprise a high k gate dielectric material, wherein the dielectric constant may comprise a value greater than about 4. Example of high k gate dielectric materials may include but are not limited to hafnium oxide, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium oxide, and lead zinc niobate. In one embodiment, the gate dielectric material 182 may be formed substantially conformally around the channel nanowires $120_1$, $120_2$, and $120_3$, and may form a substantially conformal layer on the first sacrificial spacer 152 and the second sacrificial spacer 154. The gate dielectric material 182 may be deposited using any method well-known in the art to yield a conformal layer, such as, but not limited to, atomic layer deposition (ALD) and various implementations of chemical vapor deposition (CVD), such as atmospheric pressure CVD (APCVD), low pressure CVD (LPCVD), and plasma enhanced CVD (PECVD).

Figure 11:
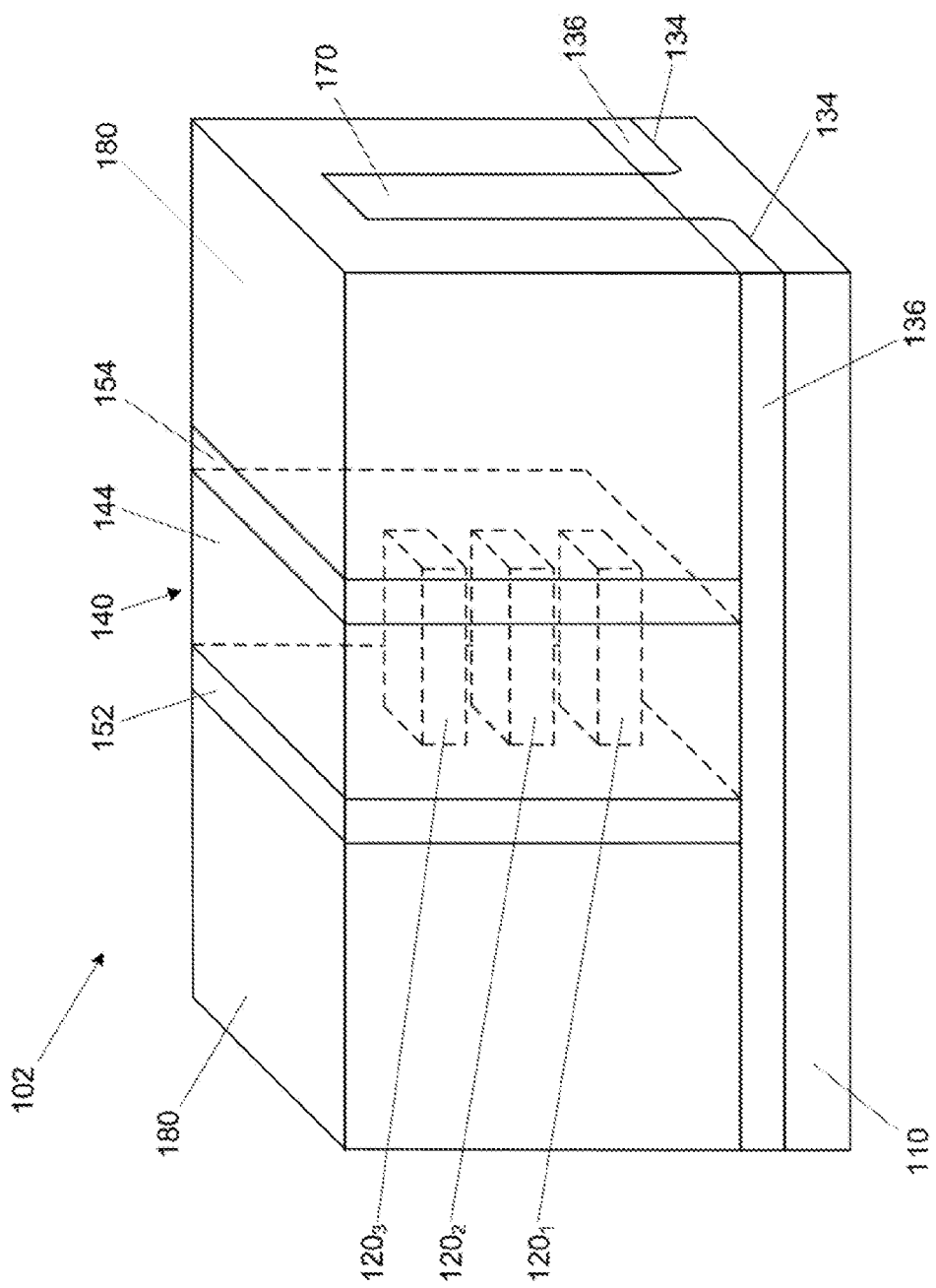

As shown in FIG. 11, a gate electrode material 144 may then be formed around the channel nanowires $120_1$, $120_2$, and $120_3$ to form a gate electrode 140 and thereby forming a microelectronic structure 102. The gate electrode material 144 may comprise any appropriate conductive material, including, but not limited to, pure metal and alloys of titanium, tungsten, tantalum, aluminum, copper, ruthenium, cobalt, chromium, iron, palladium, molybdenum, manganese, vanadium, gold, silver, and niobium. Less conductive metal carbides, such as titanium carbide, zirconium carbide, tantalum carbide, tungsten carbide, and tungsten carbide, may also be used. The gate electrode material may also be made from a metal nitride, such as titanium nitride and tantalum nitride, or a conductive metal oxide, such as ruthenium oxide. The gate electrode material may also include alloys with rare earths, such as terbium and dysprosium, or noble metals such as platinum.

Figure 12:
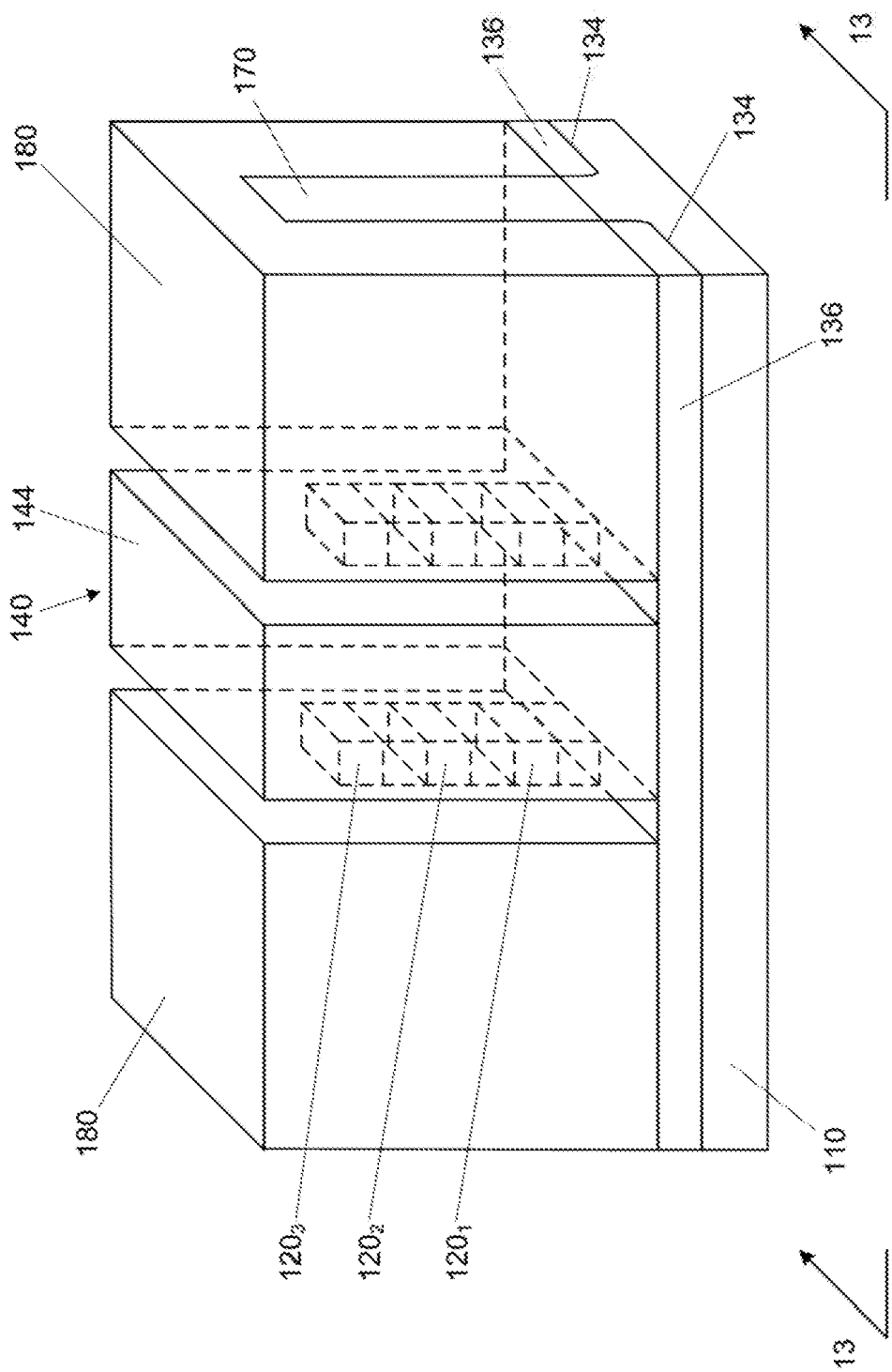
Figure 13:
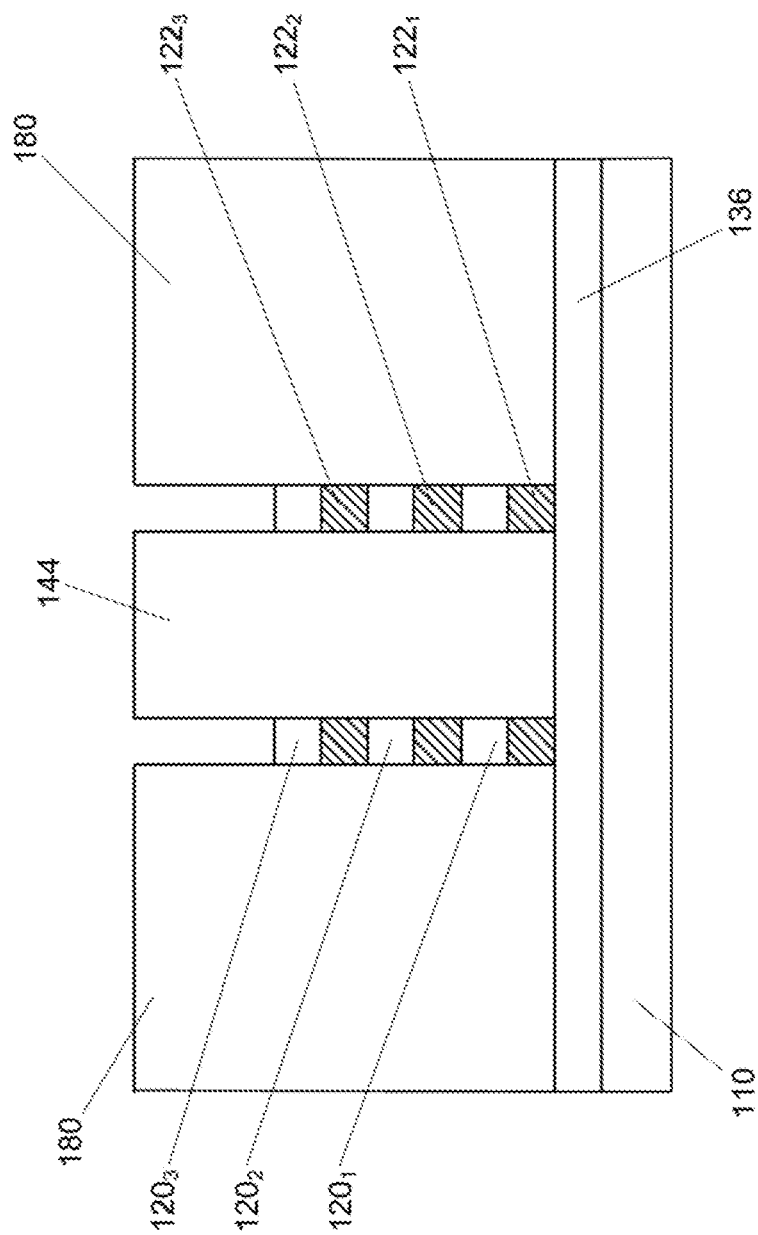

As shown in FIGS. 12 and 13, the first sacrificial spacer 152 and the second sacrificial spacer 154 (see FIG. 11) may be removed. The first sacrificial spacer 152 and the second sacrificial spacer 154 may be removed by any appropriate process, including, but not limited to, etching processes.

Figure 14:
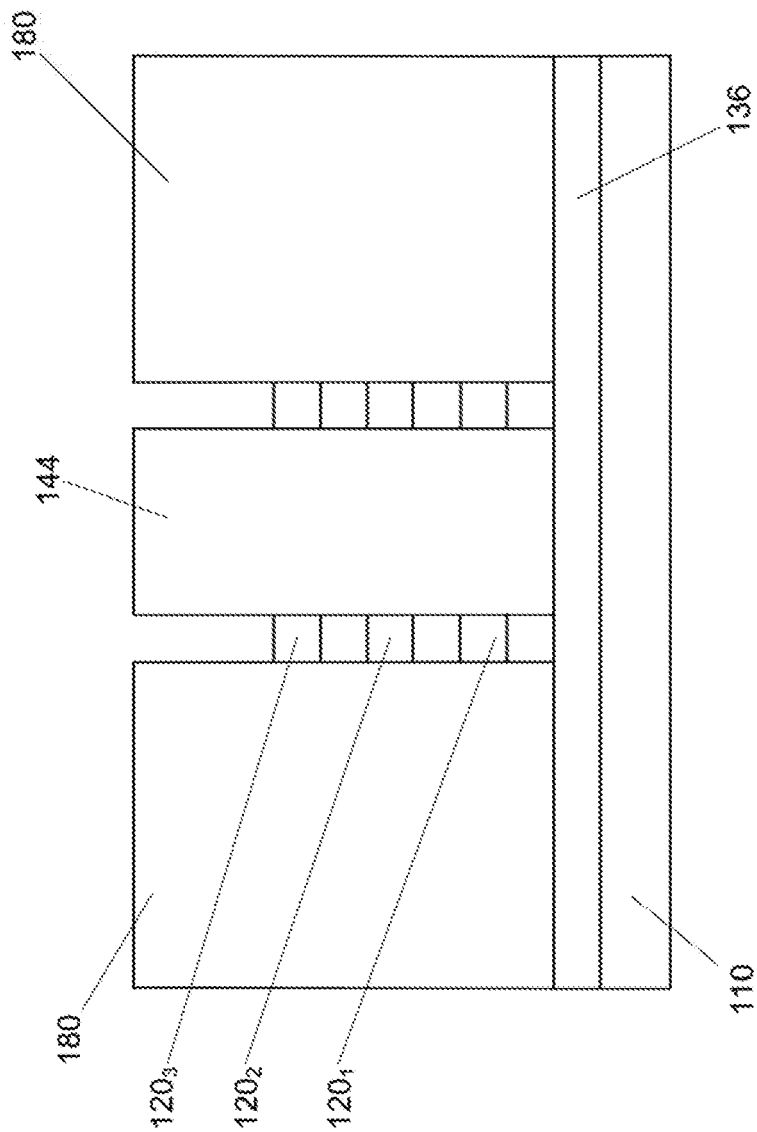

As shown in FIG. 13 (side view along line 13-13 of FIG. 12), the removal of the first sacrificial spacer 152 and the second sacrificial spacer 154 exposes the sacrificial material layers $122_1$, $122_2$, and $122_3$. As shown in FIG. 14, the sacrificial material layers $122_1$, $122_2$, and $122_3$ may be removed by any appropriate technique, such as a wet etch, a combination of wet etching and oxidation, or a dry etch (plasma or plasmaless) that selectively removes the sacrificial material layers $122_1$, $122_2$, and $122_3$ while not etching the channel nanowires $124_1$, $124_2$, and $124_3$. In one embodiment, wherein the sacrificial material layers $122_1$, $122_2$, and $122_3$ are silicon and the channel nanowires $124_1$, $124_2$, and $124_3$ are silicon germanium, the wet etch may include, but is not limited to, aqueous hydroxide chemistries, including ammonium hydroxide and potassium hydroxide. In another embodiment, wherein the sacrificial material layers $122_1$, $122_2$, and $122_3$ are silicon germanium and the channel nanowires $124_1$, $124_2$, and $124_3$ are silicon, the wet etch may include, but is not limited to solutions of carboxylic acid/ nitric acid/hydrofluoric acid, and solutions of citric acid/ nitric acid/hydrofluoric acid.

Figure 15:
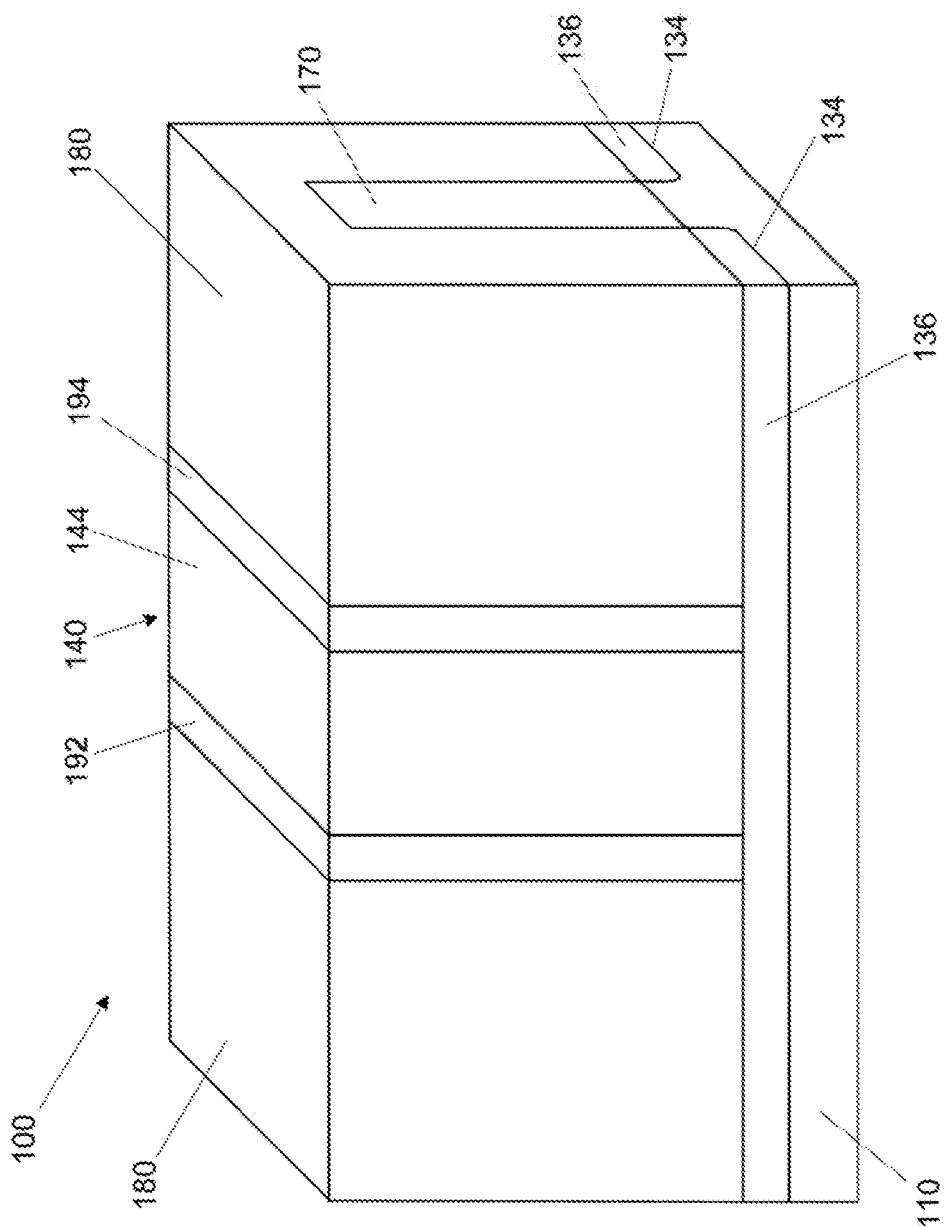

As shown in FIG. 15, a spacer material may be deposited to form a first spacer 192 and a second spacer 194 that fills the spaces between the channel nanowires $124_1$, $124_2$, and $124_3$ (see FIG. 14) to form a nanowire device 100. The spacer material used to form the first spacer 192 and the second spacer 194 may be any suitable dielectric material, such as silicon dioxide, silicon oxy-nitride, or silicon nitride. In an embodiment, the spacer material is a low-k dielectric material, i.e., having a dielectric constant less than 3.6.

Figure 16:
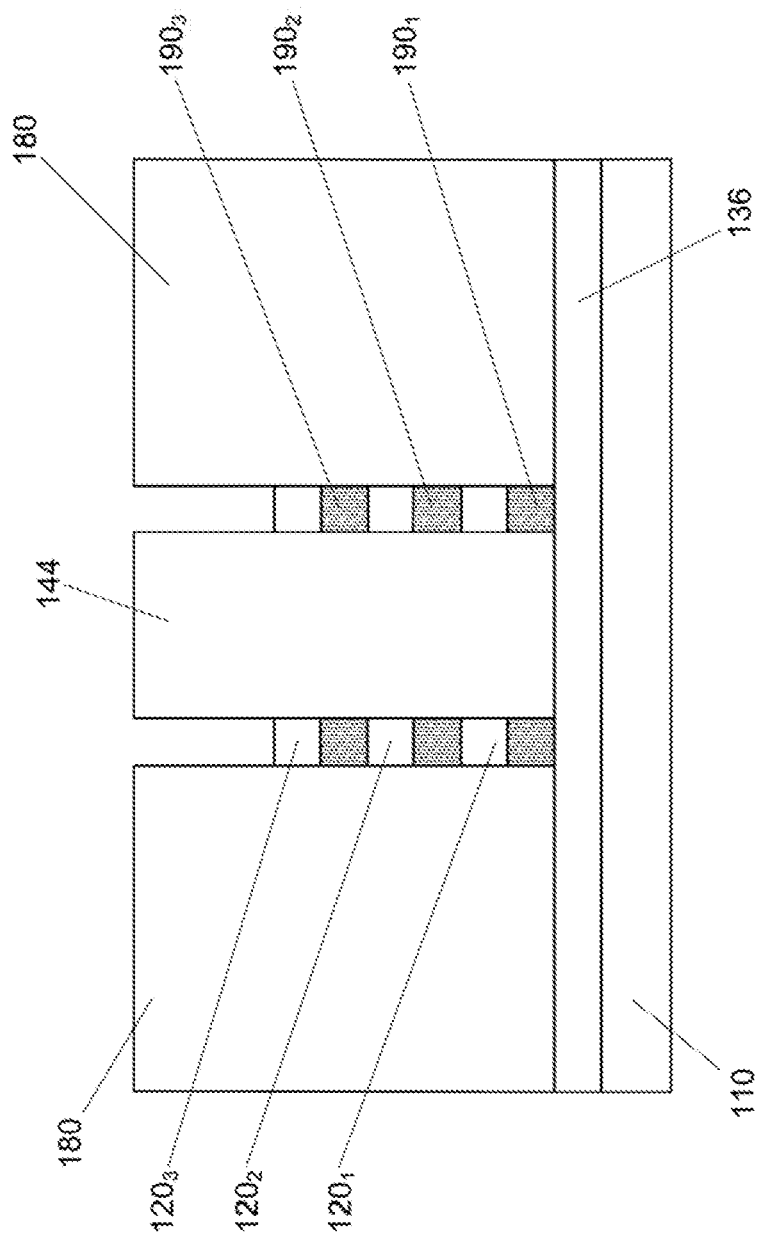
Figure 17:
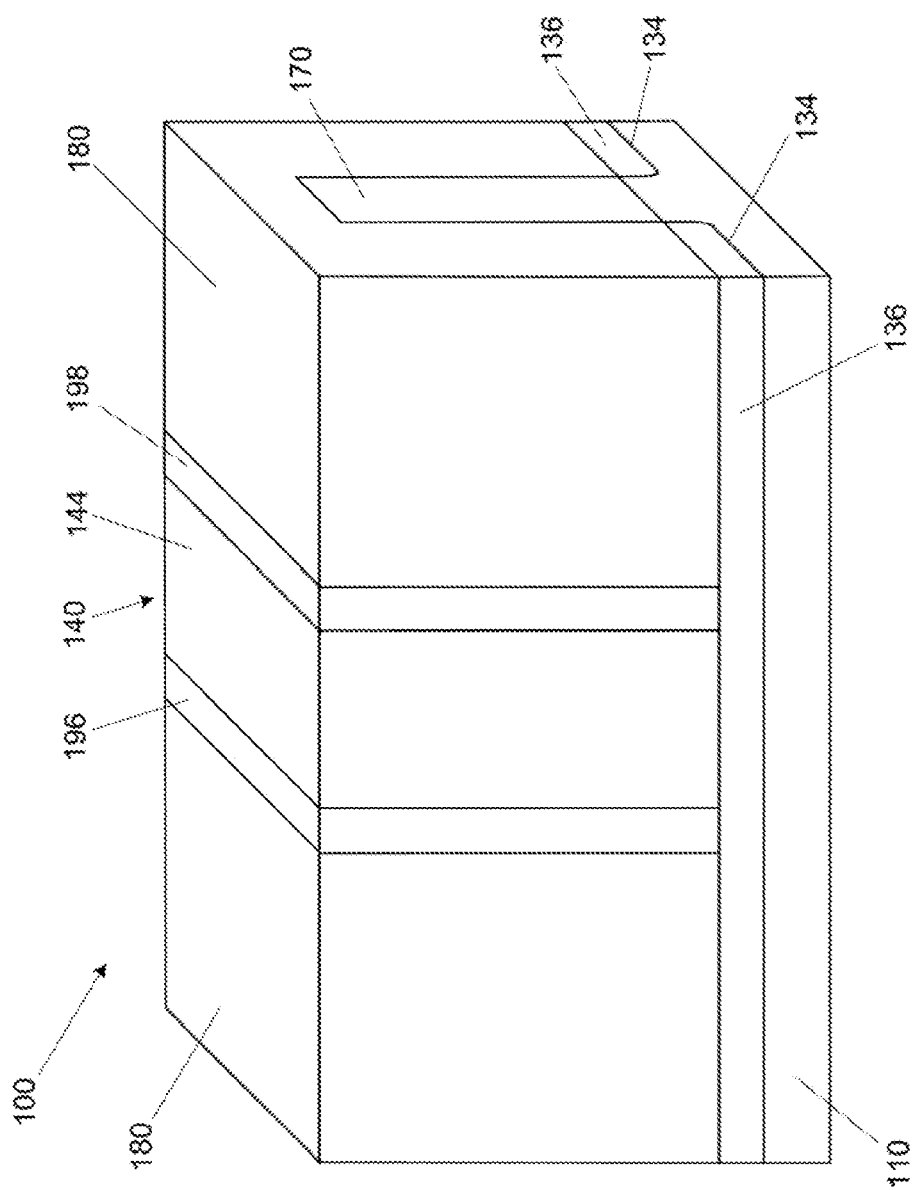

In another embodiment as shown in FIG. 16, a portion of the first spacer 192 and the second spacer 194 may be removed to define internal spacers $190_1$, $190_2$, and $190_3$ between the channel nanowires $124_1$, $124_2$, and $124_3$. As shown in FIG. 17, a dielectric material, differing from that of the internal spacers $190_1$, $190_2$, and $190_3$, may then be deposited to form a first external spacer 196 and a second external spacer 198 surrounding the internal spacers $190_1$, $190_2$, and $190_3$, and the channel nanowires $120_1$, $120_2$, and $120_3$ (see FIG. 16) and positioned between the gate electrode 140 and its respective source structure 160 or drain structure 170.

Figure 18:
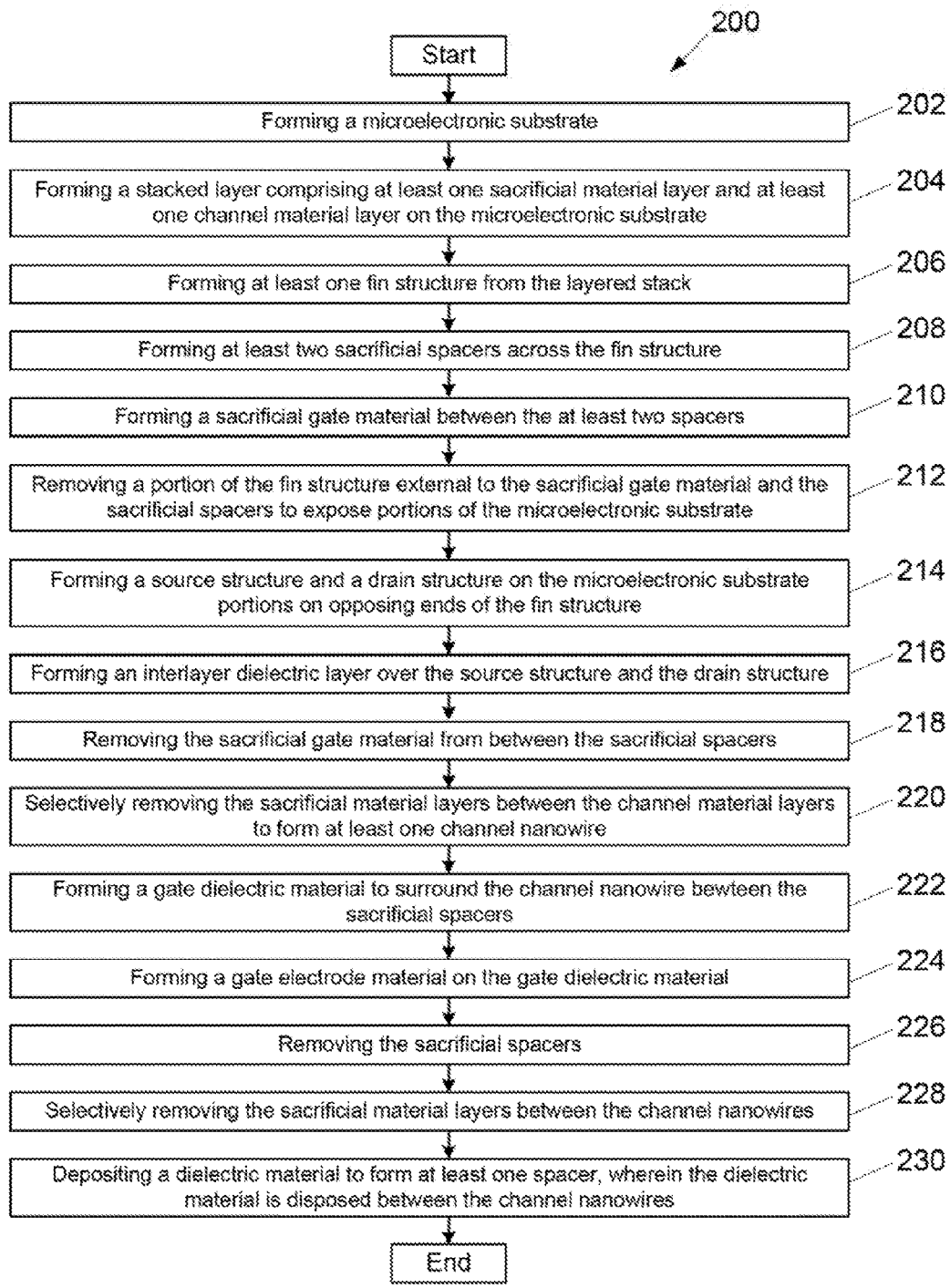
FIG. 18 is a flow chart of a process of fabricating a nanowire transistor, according to an embodiment of the present description.

FIG. 18 is a flow chart of a process 200 of fabricating a nanowire transistor structure according to an embodiment of the present description. As set forth in block 202, a microelectronic substrate may be formed. A stacked layer comprising at least one sacrificial material layer and at least one channel material layer may be formed on the microelectronic substrate, as set forth in block 204. As set forth in block 206, at least one fin structure may be formed from the layered stack, as set forth in block 208. As set forth in block 208, at least two sacrificial spacers may be formed across the fin structure. A sacrificial gate material may be formed between the at least two sacrificial spacers, as set forth in block 210. As set forth in block 212, a portion of the fin structure external to the sacrificial gate material and the spacers may be removed to expose portions of the microelectronic substrate. A source structure and a drain structure may be formed on the microelectronic substrate portions on opposing ends of the fin structure, as set forth in block 214. As set forth in block 216, an interlayer dielectric layer may be formed over the source structure and the drain structure. The sacrificial gate material may be removed from between the spacers, as set forth in block 218. As set forth in block 220, the sacrificial material layers may be selectively removed from between the channel material layer to form at least one channel nanowire. As set forth in block 222, a gate dielectric material may be formed to surround the channel nanowire between the spacers. A gate electrode material may be formed on the gate dielectric material, as set forth in block 224. As set forth in block 226, the sacrificial spacers may be removed. The sacrificial material layers between the channel nanowires may be selectively removed, as set forth in block 228. As set forth in block 230, a dielectric material may be deposited to form at least one spacer, wherein the dielectric material is disposed between the channel nanowires.

Figure 19:
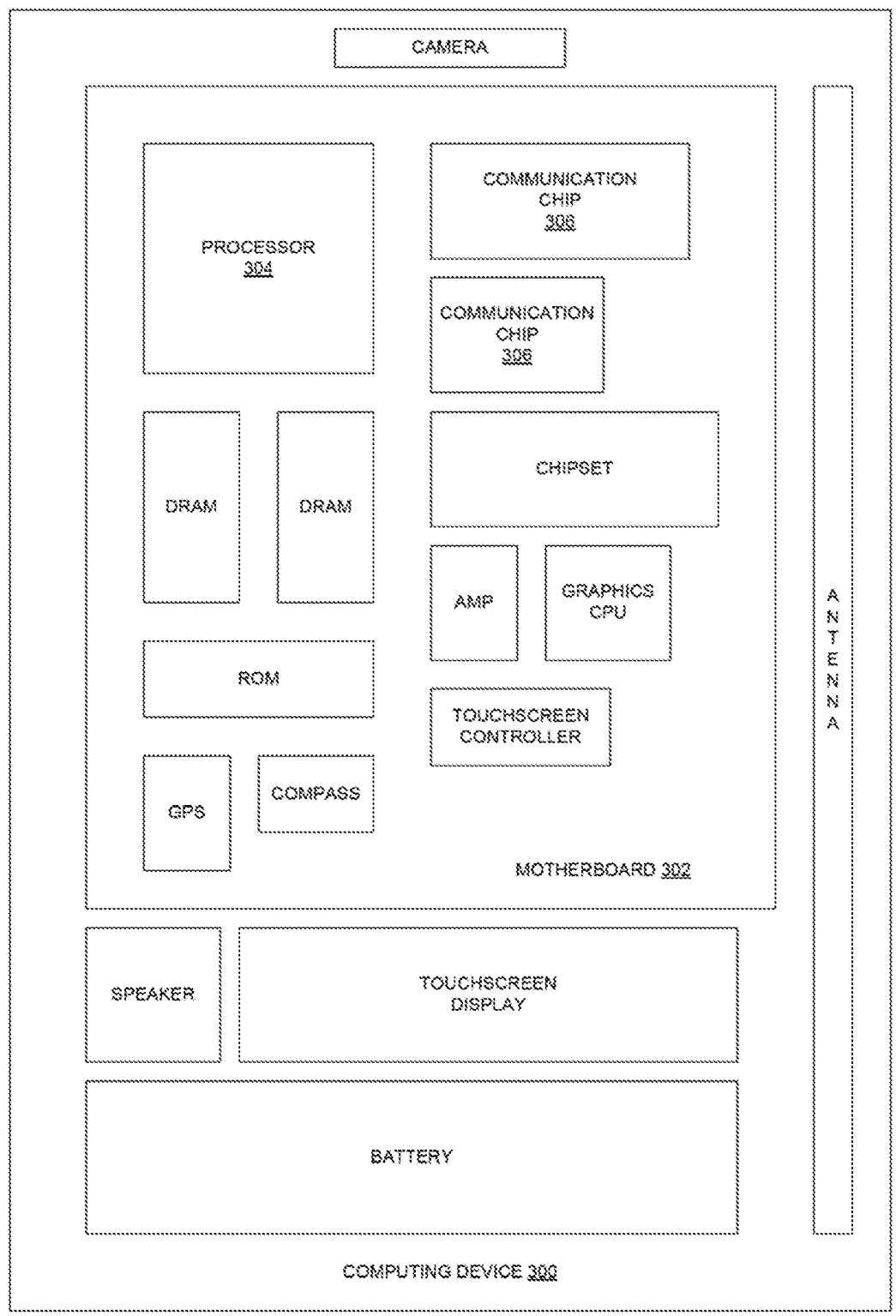
FIG. 19 illustrates a computing device in accordance with one implementation of the present description.

FIG. 19 illustrates a computing device 300 in accordance with one implementation of the present description. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, the computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the present description, the integrated circuit die of the processor includes one or more devices, such as nanowire transistors built in accordance with implementations of the present description. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the present description, the integrated circuit die of the communication chip includes one or more devices, such as nanowire transistors built in accordance with implementations of the present description.

In further implementations, another component housed within the computing device 300 may contain an integrated circuit die that includes one or more devices, such as nanowire transistors built in accordance with implementations of the present description.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

It is understood that the subject matter of the present description is not necessarily limited to specific applications illustrated in FIGS. 1-19. The subject matter may be applied to other microelectronic device and assembly applications, as well as any appropriate transistor application, as will be understood to those skilled in the art.

The following examples pertain to further embodiments, wherein Example 1 is a method of forming a nanowire transistor, comprising: providing a microelectronic structure having: a fin structure, having a plurality of channel nanowires, disposed on a substrate; a gate electrode abutting a portion of the fin structure, wherein the gate electrode surrounds each of the plurality of the channel nanowires in the fin structure; a sacrificial spacer abutting one end of the gate electrode, wherein the spacer abuts a portion of the fin structure that comprises the channel nanowires separated by sacrificial material; and one of a source and a drain abutting one end of the fin structure and the sacrificial spacer; removing the sacrificial spacer; removing the sacrificial material from between the channel nanowires; and depositing a dielectric material to form a spacer, wherein the dielectric material is disposed between the channel nanowires.

In Example 2, the subject matter of Example 1 can optionally include depositing the dielectric material to form the spacer comprising depositing a low-k dielectric material to form the spacer.

In Example 3, the subject matter of any of Examples 1 to 2 can optionally include the sacrificial spacer comprising at least one of silicon dioxide, silicon nitride, and silicon oxy nitride.

In Example 4, the subject matter of any of Examples 1 to 3 can optionally include removing a portion of the spacer to define internal spacers between the channel nanowires; and depositing another dielectric material, differing from that of the internal spacers to form an external spacer between the gate electrode and the one of a source and a drain, wherein the external spacer surrounds the internal spacers and the channel nanowires.

In Example 5, the subject matter of any of Examples 1 to 4 can optionally include the sacrificial material comprising silicon and wherein the channel nanowires comprising silicon germanium.

In Example 6, the subject matter of any of Examples 1 to 4 can optionally include the sacrificial material comprising silicon germanium layers and wherein the channel nanowires comprising silicon.

The following examples pertain to further embodiments, wherein Example 7 is a method of forming a nanowire transistor, comprising: providing a microelectronic structure having: a fin structure, having a plurality of channel nanowires, disposed on a substrate; a gate electrode abutting a portion of the fin structure, wherein the gate electrode surrounds each of the plurality of the channel nanowires in the fin structure; a first sacrificial spacer abutting one end of the gate electrode, the first spacer abuts a portion of the fin structure that comprises the channel nanowires separated by sacrificial material; a second sacrificial spacer abutting another end of the gate electrode, the second sacrificial spacer abuts another portion of the fin structure that comprises the plurality of channel nanowires separated by the sacrificial material; a source abutting one end of the fin structure and the first sacrificial spacer; and a drain abutting an opposing end of the fin structure and the second sacrificial spacer; removing the first sacrificial spacer and the second sacrificial spacer; removing the sacrificial material from between the channel nanowires; and depositing a dielectric material to form a first spacer and a second spacer, wherein the dielectric material is disposed between the channel nanowires.

In Example 8, the subject matter of Example 7 can optionally include depositing the dielectric material to form the first spacer and the second spacer comprising depositing a low-k dielectric material to form the first spacer and the second spacer.

In Example 9, the subject matter of any of Examples 7 to 8 can optionally include at least one of the first sacrificial spacer and the second sacrificial spacer comprising at least one of silicon dioxide, silicon nitride, and silicon oxy nitride.

In Example 10, the subject matter of any of Examples 7 to 9 can optionally include removing a portion of the first spacer and a portion of the second spacer define internal spacers between the channel nanowires; and depositing a dielectric material, differing from that of the internal spacers to form a first external spacer between the gate electrode and the source, and a second external spacer between the gate electrode, wherein the first external spacer and the second external spacer surrounding the internal spacers and the channel nanowires.

In Example 11, the subject matter of any of Examples 7 to 10 can optionally include the sacrificial material comprising silicon and wherein the channel nanowires comprising silicon germanium.

In Example 12, the subject matter of any of Examples 7 to 10 can optionally include the sacrificial material comprising silicon germanium layers and wherein the channel nanowires comprising silicon.

The following examples pertain to further embodiments, wherein Example 13 is a method of forming a nanowire transistor, comprising: forming a microelectronic substrate; forming a stacked layer on the microelectronic substrate comprising at least one sacrificial material layer and at least one channel material layer; forming at least one fin structure formed from the layered stack; forming at least two sacrificial spacers across the fin structure; forming a sacrificial gate material between the at least two sacrificial spacers; removing a portion of the fin structure external to the sacrificial gate material and the sacrificial spacers to expose portions of the microelectronic substrate; forming a source structure and a drain structure on the microelectronic substrate portions on opposing ends of the fin structure; forming an interlayer dielectric layer over the source structure and the drain structure; removing the sacrificial gate material from between the sacrificial spacers; selectively removing the sacrificial material layers from between the channel material layer to form at least one channel nanowire; forming a gate dielectric material to surround the channel nanowire between the at least two sacrificial spacers; forming a gate electrode on the gate dielectric material; removing the at least two sacrificial spacers; selectively removing the sacrificial material layers between the channel nanowires; and depositing a dielectric material to form at least one spacer, wherein the dielectric material is disposed between the channel nanowires.

In Example 14, the subject matter of Example 13 can optionally include depositing the dielectric material to form the at least one comprising depositing a low-k dielectric material to form the at least one spacer.

In Example 15, the subject matter of any of Examples 13 to 14 can optionally include at least one of the at least two sacrificial spacers comprising at least one of silicon dioxide, silicon nitride, and silicon oxy nitride.

In Example 16, the subject matter of any of Examples 13 to 15 can optionally include removing a portion of the at least one spacer to define internal spacers between the channel nanowires; and depositing another dielectric material, differing from that of the internal spacers to form at least one external spacer surrounding the internal spacers and the channel nanowires.

In Example 17, the subject matter of any of Examples 13 to 16 can optionally include forming a stacked layer on the microelectronic substrate having at least one sacrificial material layer and at least one channel material layer comprising forming the stacked layer on the microelectronic substrate comprising at least one silicon sacrificial layer and at least one silicon germanium channel layer.

In Example 18, the subject matter of any of Examples 13 to 16 can optionally include forming a stacked layer on the microelectronic substrate having at least one sacrificial material layer and at least one channel material layer comprising forming the stacked layer on the microelectronic substrate comprising at least one silicon germanium sacrificial layer and at least one silicon channel layer.

Having thus described in detail embodiments of the present description, it is understood that the present description defined by the appended claims is not to be limited by particular details set forth in the above description, as many apparent variations thereof are possible without departing from the spirit or scope thereof.

What is claimed is:
1. A method of forming a nanowire transistor, comprising:
   providing a microelectronic structure having:
   a fin structure, having a plurality of channel nanowires, disposed on a substrate;
   a gate structure abutting a portion of the fin structure, wherein the gate structure comprises a gate dielectric surrounds each of the plurality of the channel nanowires in the fin structure and a gate electrode abutting the gate dielectric;

a sacrificial spacer abutting one end of the gate electrode, wherein the sacrificial spacer abuts a portion of the fin structure that comprises the channel nanowires separated by sacrificial material; and
one of a source and a drain abutting one end of the fin structure and the sacrificial spacer;
removing the sacrificial spacer;
removing the sacrificial material from between the channel nanowires; and
depositing a dielectric material to form a spacer, wherein the dielectric material is disposed between the channel nanowires.

2. The method of claim 1, wherein depositing the dielectric material to form the spacer comprises depositing a low-k dielectric material to form the spacer.

3. The method of claim 1, wherein the sacrificial spacer comprises at least one of silicon dioxide, silicon nitride, and silicon oxy nitride.

4. The method of claim 1, further including:
removing a portion of the spacer to define internal spacers between the channel nanowires; and
depositing another dielectric material, differing from that of the internal spacers to form an external spacer between the gate electrode and the one of a source and a drain, wherein the external spacer surrounds the internal spacers and the channel nanowires.

5. The method of claim 1, wherein the sacrificial material comprises silicon and wherein the channel nanowires comprise silicon germanium.

6. The method of claim 1, wherein the sacrificial material comprises silicon germanium layers and wherein the channel nanowires comprise silicon.

7. A method of forming a nanowire transistor, comprising:
providing a microelectronic structure having:
a fin structure, having a plurality of channel nanowires, disposed on a substrate;
a gate structure abutting a portion of the fin structure, wherein the gate structure comprises a gate dielectric surrounding each of the plurality of the channel nanowires in the fin structure and a gate electrode abutting the gate dielectric;
a first sacrificial spacer abutting one end of the gate electrode, the first sacrificial spacer abuts a portion of the fin structure that comprises the channel nanowires separated by sacrificial material;
a second sacrificial spacer abutting another end of the gate electrode, the second sacrificial spacer abuts another portion of the fin structure that comprises the plurality of channel nanowires separated by the sacrificial material;
a source abutting one end of the fin structure and the first sacrificial spacer; and
a drain abutting an opposing end of the fin structure and the second sacrificial spacer;
removing the first sacrificial spacer and the second sacrificial spacer;
removing the sacrificial material from between the channel nanowires; and
depositing a dielectric material to form a first spacer and a second spacer, wherein the dielectric material is disposed between the channel nanowires.

8. The method of claim 7, wherein depositing the dielectric material to form the first spacer and the second spacer comprises depositing a low-k dielectric material to form the first spacer and the second spacer.

9. The method of claim 7, wherein at least one of the first sacrificial spacer and the second sacrificial spacer comprises at least one of silicon dioxide, silicon nitride, and silicon oxy nitride.

10. The method of claim 7, further including:
removing a portion of the first spacer and a portion of the second spacer define internal spacers between the channel nanowires; and
depositing a dielectric material, differing from that of the internal spacers, to form a first external spacer between the gate electrode and the source, and a second external spacer between the gate electrode, wherein the first external spacer and the second external spacer surrounding the internal spacers and the channel nanowires.

11. The method of claim 7, wherein the sacrificial material comprises silicon and wherein the channel nanowires comprise silicon germanium.

12. The method of claim 7, wherein the sacrificial material comprises silicon germanium layers and wherein the channel nanowires comprise silicon.

13. A method of forming a nanowire transistor, comprising:
forming a microelectronic substrate;
forming a stacked layer on the microelectronic substrate comprising at least one sacrificial material layer and at least one channel material layer;
forming at least one fin structure formed from the layered stack;
forming at least two sacrificial spacers across the fin structure;
forming a sacrificial gate material between the at least two sacrificial spacers;
removing a portion of the fin structure external to the sacrificial gate material and the sacrificial spacers to expose portions of the microelectronic substrate;
forming a source structure and a drain structure on the microelectronic substrate portions on opposing ends of the fin structure;
forming an interlayer dielectric layer over the source structure and the drain structure;
removing the sacrificial gate material from between the sacrificial spacers;
selectively removing the sacrificial material layers from between the channel material layer to form at least one channel nanowire;
forming a gate dielectric material to surround the channel nanowire between the at least two sacrificial spacers;
forming a gate electrode on the gate dielectric material;
removing the at least two sacrificial spacers;
selectively removing the sacrificial material layers between the channel nanowires; and
depositing a dielectric material to form at least one spacer, wherein the dielectric material is disposed between the channel nanowires.

14. The method of claim 13, wherein depositing the dielectric material to form the at least one spacer comprises depositing a low-k dielectric material to form the at least one spacer.

15. The method of claim 13, wherein at least one of the at least two sacrificial spacers comprises at least one of silicon dioxide, silicon nitride, and silicon oxy nitride.

16. The method of claim 13, further including:
removing a portion of the at least one spacer to define internal spacers between the channel nanowires; and depositing another dielectric material, differing from that of the internal spacers to form at least one external spacer surrounding the internal spacers and the channel nanowires.

17. The method of claim 13, wherein forming a stacked layer on the microelectronic substrate comprising at least one sacrificial material layer and at least one channel material layer comprises forming the stacked layer on the microelectronic substrate comprising at least one silicon sacrificial layer and at least one silicon germanium channel layer.

18. The method of claim 13, wherein forming a stacked layer on the microelectronic substrate comprising at least one sacrificial material layer and at least one channel material layer comprises forming the stacked layer on the microelectronic substrate comprising at least one silicon germanium sacrificial layer and at least one silicon channel layer.

* * * * *